(12) United States Patent
Sato et al.

(10) Patent No.: US 11,928,293 B2
(45) Date of Patent: Mar. 12, 2024

(54) INPUT DEVICE

(71) Applicant: Alps Alpine Co., Ltd., Tokyo (JP)

(72) Inventors: Takashi Sato, Miyagi-ken (JP);
Shunsuke Sato, Miyagi-ken (JP);
Shinya Urayama, Miyagi-ken (JP)

(73) Assignee: Alps Alpine Co., Ltd. (JP)

( * ) Notice: Subject to any disclaimer, the term of this patent is extended or adjusted under 35 U.S.C. 154(b) by 0 days.

(21) Appl. No.: 17/885,688

(22) Filed: Aug. 11, 2022

(65) Prior Publication Data

US 2022/0382397 A1 Dec. 1, 2022

Related U.S. Application Data

(63) Continuation of application No. PCT/JP2021/004646, filed on Feb. 8, 2021.

(30) Foreign Application Priority Data

Mar. 4, 2020 (JP) ................. 2020-037136

(51) Int. Cl.
*G06F 3/044* (2006.01)
*G06F 3/01* (2006.01)
(Continued)

(52) U.S. Cl.
CPC .............. *G06F 3/044* (2013.01); *G06F 3/016* (2013.01); *H01H 13/14* (2013.01); *H03K 17/962* (2013.01); *H01H 2215/05* (2013.01)

(58) Field of Classification Search
CPC ...... G06F 3/016; G06F 3/03547; G06F 3/044; H01H 13/14; H01H 13/26;
(Continued)

(56) References Cited

U.S. PATENT DOCUMENTS 10,068,728 B2 * 9/2018 Huska .................... H01H 13/85
11,511,186 B2 * 11/2022 VanWyk ............. G06F 3/03547
(Continued)

FOREIGN PATENT DOCUMENTS

JP 2014-081721 A 5/2014
JP 2015-230620 A 12/2015

OTHER PUBLICATIONS

International Search Report (English translation) for corresponding International Application No. PCT/JP2021/004646, dated Apr. 13, 2021 (10 Pages).

*Primary Examiner* — Kenneth Bukowski
(74) *Attorney, Agent, or Firm* — Harness, Dickey & Pierce, P.L.C.

(57) ABSTRACT

An input device is characterized in that in a first stroke region in which an operation panel is pushed during a touch operation, a first reaction force that occurs by pushing the operation panel is generated by the first elastic portion. In a second stroke region including a stroke longer than in the first stroke region and a stroke for performing a push operation, a second reaction force that occurs by pushing the operation panel is a resultant force generated by a first elastic portion and the push switch. In the vicinity of a boundary between the first stroke region and the second stroke region, the amount of change in the first reaction force with respect to a stroke length is less than the amount of change in the second reaction force with respect to a stroke length.

7 Claims, 16 Drawing Sheets

(51) Int. Cl.
*H01H 13/14* (2006.01)
*H03K 17/96* (2006.01)

(58) Field of Classification Search
CPC ..... H01H 2003/008; H01H 2003/0293; H01H 2215/002; H01H 2215/004; H01H 2215/006; H01H 2215/018; H01H 2215/05; H01H 2217/008; H03K 17/962; H03K 2217/96062
See application file for complete search history.

(56) References Cited

U.S. PATENT DOCUMENTS

| | | | |
|---|---|---|---|
| 2006/0119586 A1* | 6/2006 | Grant | G06F 3/03547 345/173 |
| 2010/0079404 A1* | 4/2010 | Degner | G06F 3/042 345/173 |
| 2010/0200309 A1* | 8/2010 | Yilmaz | G06F 3/03547 178/18.03 |
| 2011/0102358 A1* | 5/2011 | Aono | G06F 3/0414 345/173 |
| 2015/0357132 A1* | 12/2015 | Ishikawa | G06F 3/0338 200/521 |
| 2016/0103493 A1* | 4/2016 | Taninaka | B06B 1/0246 310/317 |
| 2018/0329497 A1* | 11/2018 | Oshita | G06F 3/0416 |
| 2018/0329498 A1* | 11/2018 | Takahashi | G06F 3/047 |
| 2021/0012985 A1* | 1/2021 | Urayama | H01H 19/04 |
| 2021/0165498 A1* | 6/2021 | Saito | G01L 1/144 |

* cited by examiner

INPUT DEVICE

CLAIM OF PRIORITY

This application is a Continuation of International Application No. PCT/JP2021/004646 filed on Feb. 8, 2021, which claims benefit of Japanese Patent Application No. 2020-037136 filed on Mar. 4, 2020. The entire contents of each application noted above are hereby incorporated by reference.

BACKGROUND OF THE INVENTION

1. Field of the Invention

The present invention relates to an input device.

2. Description of the Related Art

In recent years, an input device that allows an operator to touch an operation surface thereof and input information (for example, a touchpad) has been in widespread use (refer to, for example, Japanese Unexamined Patent Application Publication No. 2015-230620, Japanese Unexamined Patent Application Publication No. 2016-95718, and Japanese Unexamined Patent Application Publication No. 2016-114980). The input device allows an operator to perform a touch operation and a push operation. The touch operation is used by the operator to input information by moving the finger with the finger touching the surface of a touchpad which is an input device, while the push operation is used to input information by pressing the touchpad to turn on a switch provided inside the touchpad.

However, both a touch operation and a push operation are performed on the above-described touchpad with the operator's finger in contact with a surface of the touchpad. For this reason, the operator cannot recognize which operation they are performing and, thus, they may accidentally perform a push operation while performing a touch operation.

Accordingly, there is a demand for an input device capable of preventing an operator who is touching the input device with their finger from accidentally performing a push operation while performing a touch operation.

SUMMARY OF THE INVENTION

According to one aspect of the present embodiment, an input device includes an operation panel including an electrostatic sensor, where the operation panel allows a touch operation and a push operation to be performed thereon, a push switch configured to generate an operation feeling for an operator, a transmission member disposed between the operation panel and the push switch, a first elastic portion configured to support the transmission member, and an actuator configured to generate vibration. The touch operation is an operation performed by the operator to touch a surface of the operation panel with the operator's finger and move the operator's finger. If lateral movement of the finger is detected by the electrostatic sensor in the touch operation, the actuator vibrates, and the vibration is transmitted to the operation panel via the transmission member. The push operation is an operation performed by the operator to push the operation panel, and the first elastic portion and the push switch are pushed via the transmission member. In a first stroke region in which the operation panel is pushed in the touch operation, a first reaction force exerted by pushing the operation panel is generated by the first elastic portion. In a second stroke region subsequent to the first stroke region in the push operation, a second reaction force exerted by pushing the operation panel is a resultant force of the reaction force generated by the first elastic portion and the operation feeling generated by the push switch. In the vicinity of a boundary between the first stroke region and the second stroke region, an amount of change in the first reaction force with respect to a stroke length is less than an amount of change in the second reaction force with respect to a stroke length.

According to the input device, it is possible to prevent an operator with their finger in contact with the input device from accidentally performing a push operation while performing a touch operation.

DESCRIPTION OF THE PREFERRED EMBODIMENTS

Figure 1:
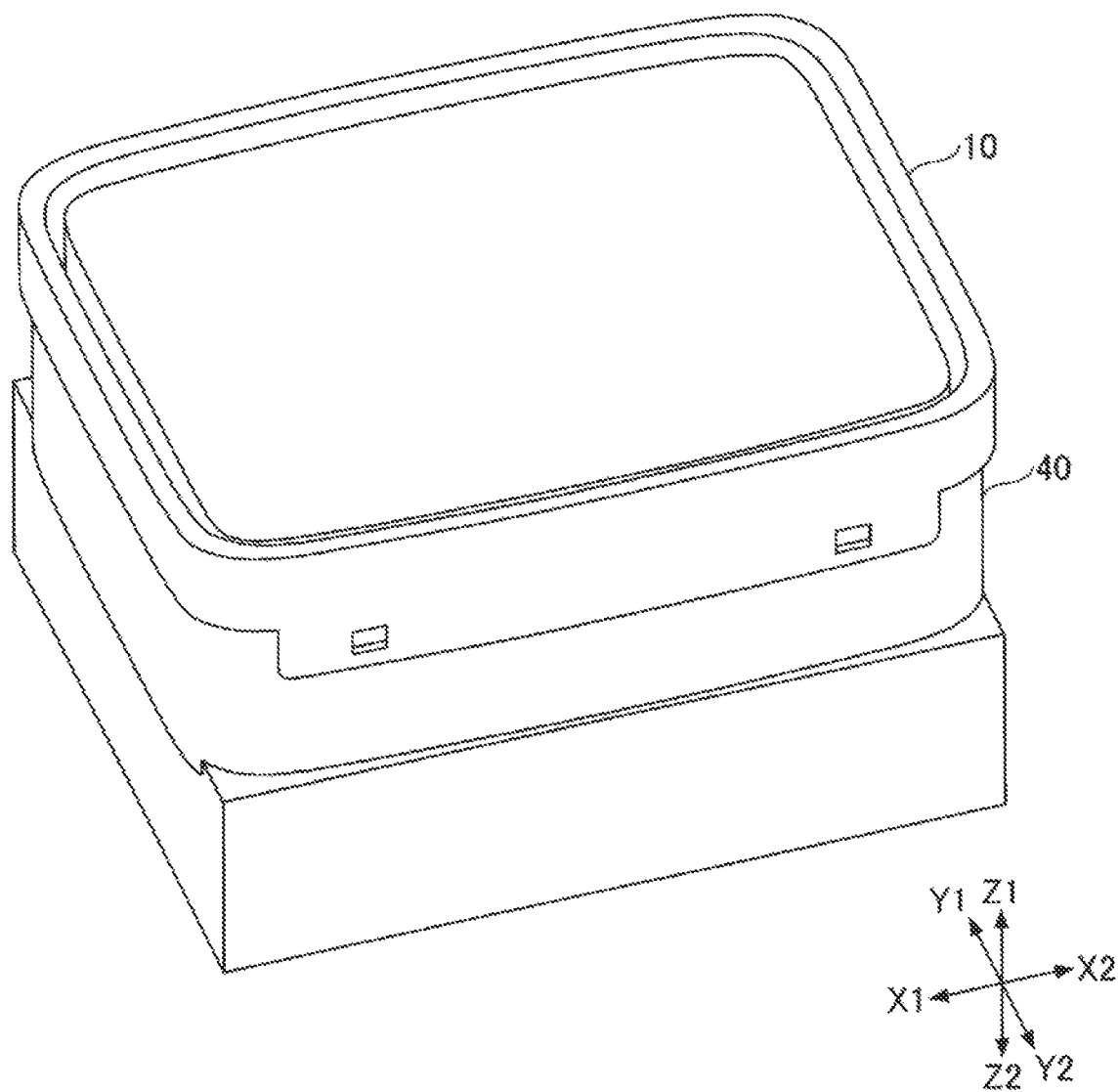
FIG. 1 is a perspective view of an input device according to the present embodiment.

An embodiment is described below. Note that the same members and the like are identified by the same reference numerals without further description. As used herein, the terms "X1-X2 direction", "Y1-Y2 direction", and "Z1-Z2 direction" refer to directions orthogonal to one another. Furthermore, a plane including the X1-X2 direction and the Y1-Y2 direction is referred to as an XY plane, a plane including the Y1-Y2 direction and the Z1-Z2 direction is referred to as a YZ plane, and a plane including the Z1-Z2 direction and the X1-X2 direction is referred to as a ZX plane.

Figure 2:
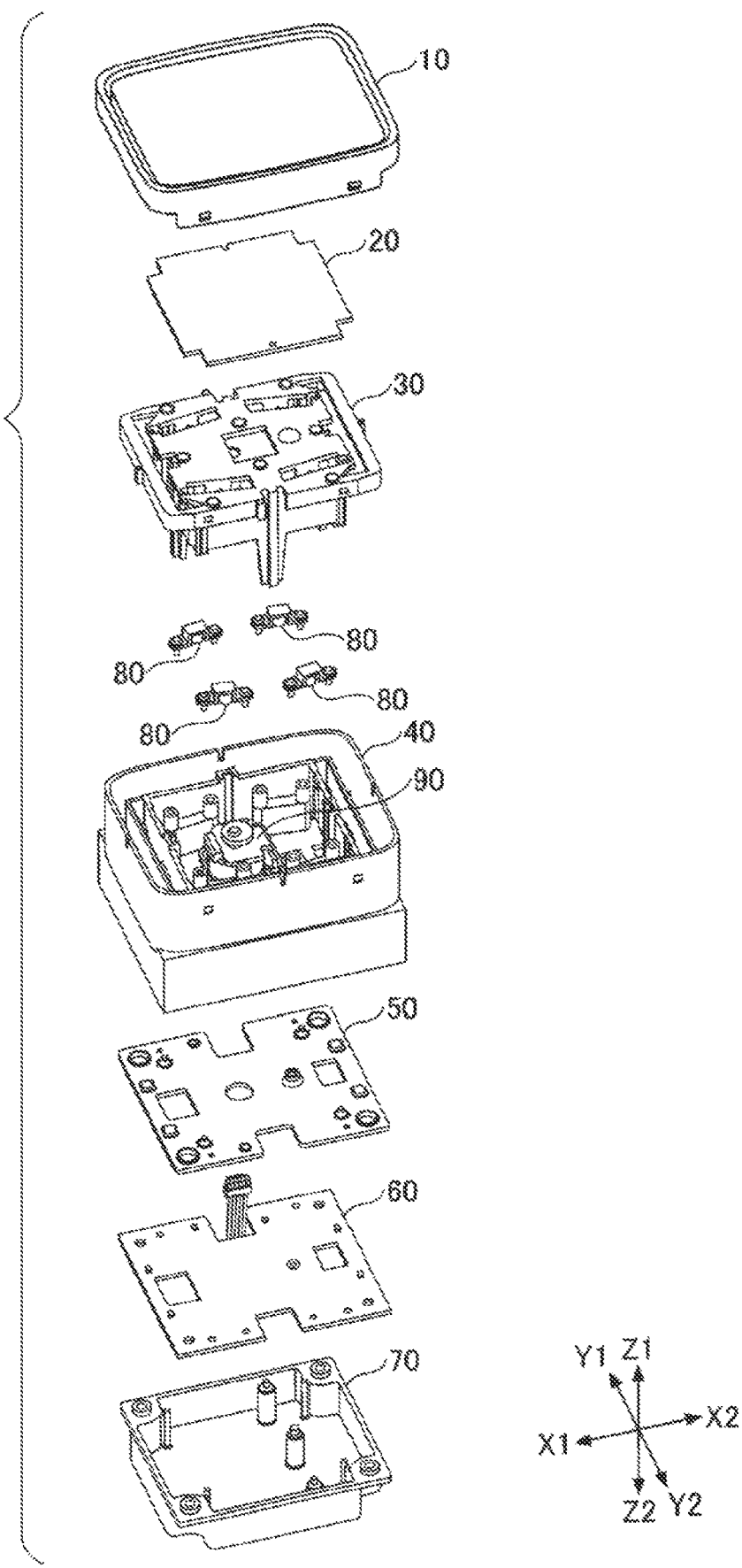
FIG. 2 is an exploded perspective view of the input device according to the present embodiment.
Figure 3:
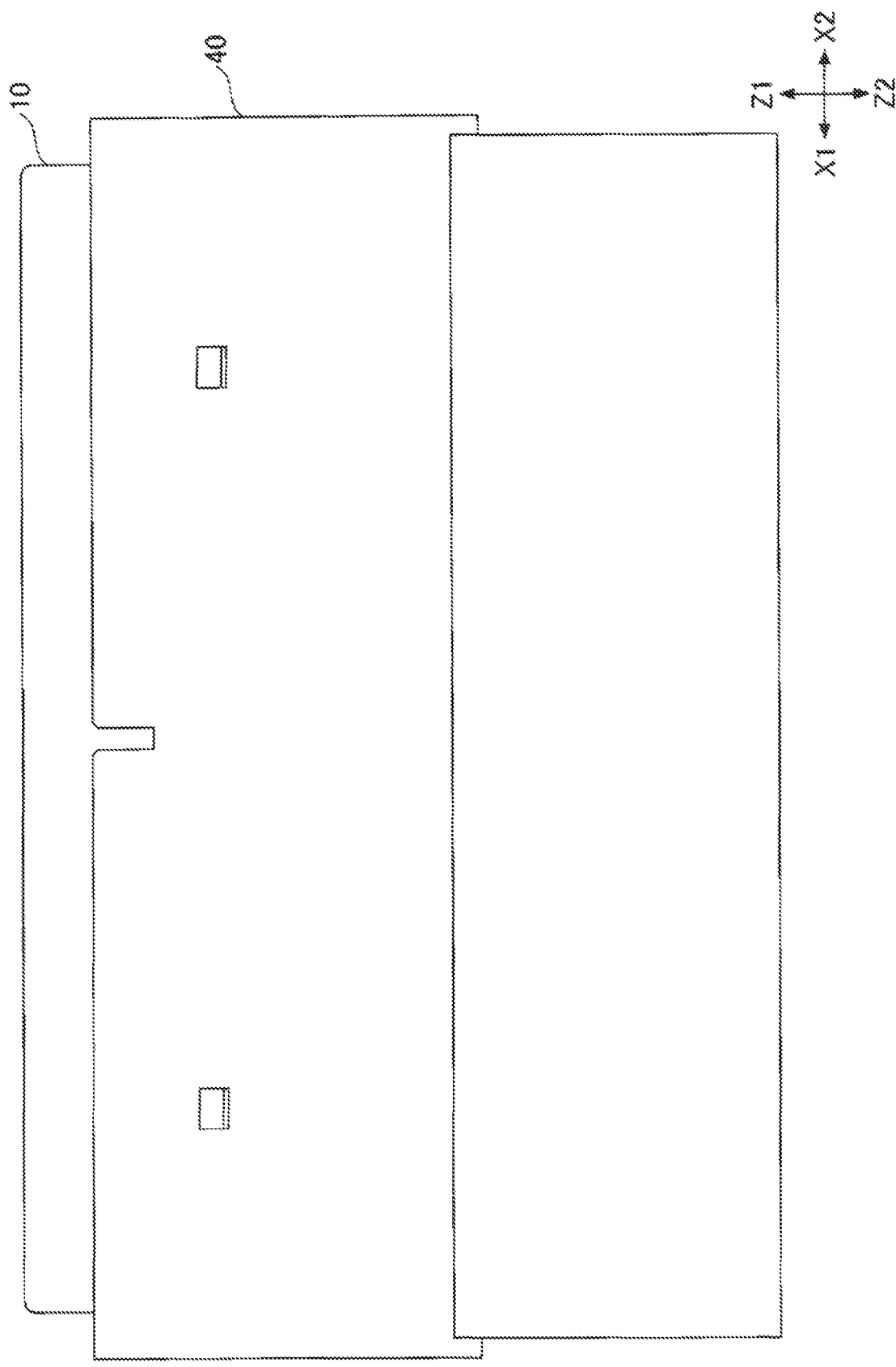
FIG. 3 is a side view of the input device according to the present embodiment.

An input device according to the present embodiment is described with reference to FIGS. 1 to 3. FIG. 1 is a perspective view of the input device according to the present embodiment, FIG. 2 is an exploded perspective view of the input device, and FIG. 3 is a side view of the input device.

The input device according to the present embodiment includes an operation panel 10, an electrostatic sensor 20, a slider 30, a housing 40, a waterproof rubber sheet 50, a circuit board 60, a lower case 70, a second damper 80, an actuator 90, and the like. The actuator 90 is, for example, a solenoid actuator and is mounted inside the housing 40.

The operation panel 10 is a panel that the operator's finger directly touches. The operation panel 10 allows an operator to perform a touch operation thereon, that is, to move the operator's finger along the XY plane parallel to the surface of the operation panel 10 while touching the operation panel 10 and a push operation, that is, to push the operation panel 10 in a direction orthogonal to the operation panel 10 (i.e., the Z2 direction).

The electrostatic sensor 20 is a capacitance sensor or the like. When an operator's finger touches the operation panel 10 as in, for example, a touch operation, the electrostatic sensor 20 can detect the position of the operator's finger on the operation panel 10 and lateral movement of the finger which touches the surface of the operation panel 10.

The slider 30, which is a transmission member, can move in the Z1-Z2 direction. For example, when the operator's finger performs an operation to push the operation panel 10 in the Z2 direction, like a push operation, the slider 30 slides and moves in the Z2 direction along with the movement of the operation panel 10.

The waterproof rubber sheet 50 is made of an elastic material, such as silicon rubber, and is attached onto the circuit board 60.

The electrostatic sensor 20, the slider 30, the waterproof rubber sheet 50, the circuit board 60, the second damper 80, and the like are disposed inside the housing 40.

Figure 4:
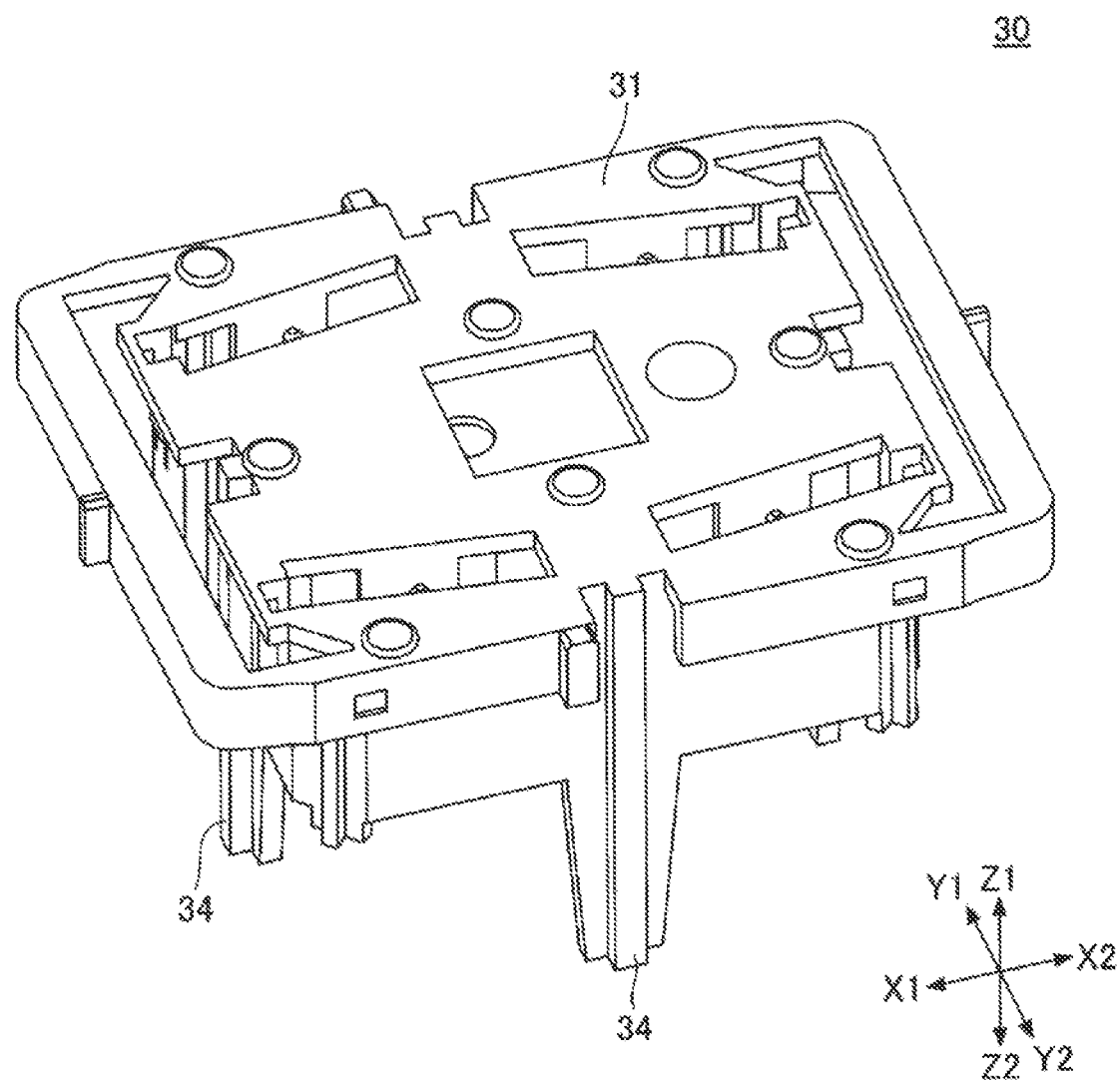
FIG. 4 is a first perspective view of a slider of the input device according to the present embodiment.
Figure 5:
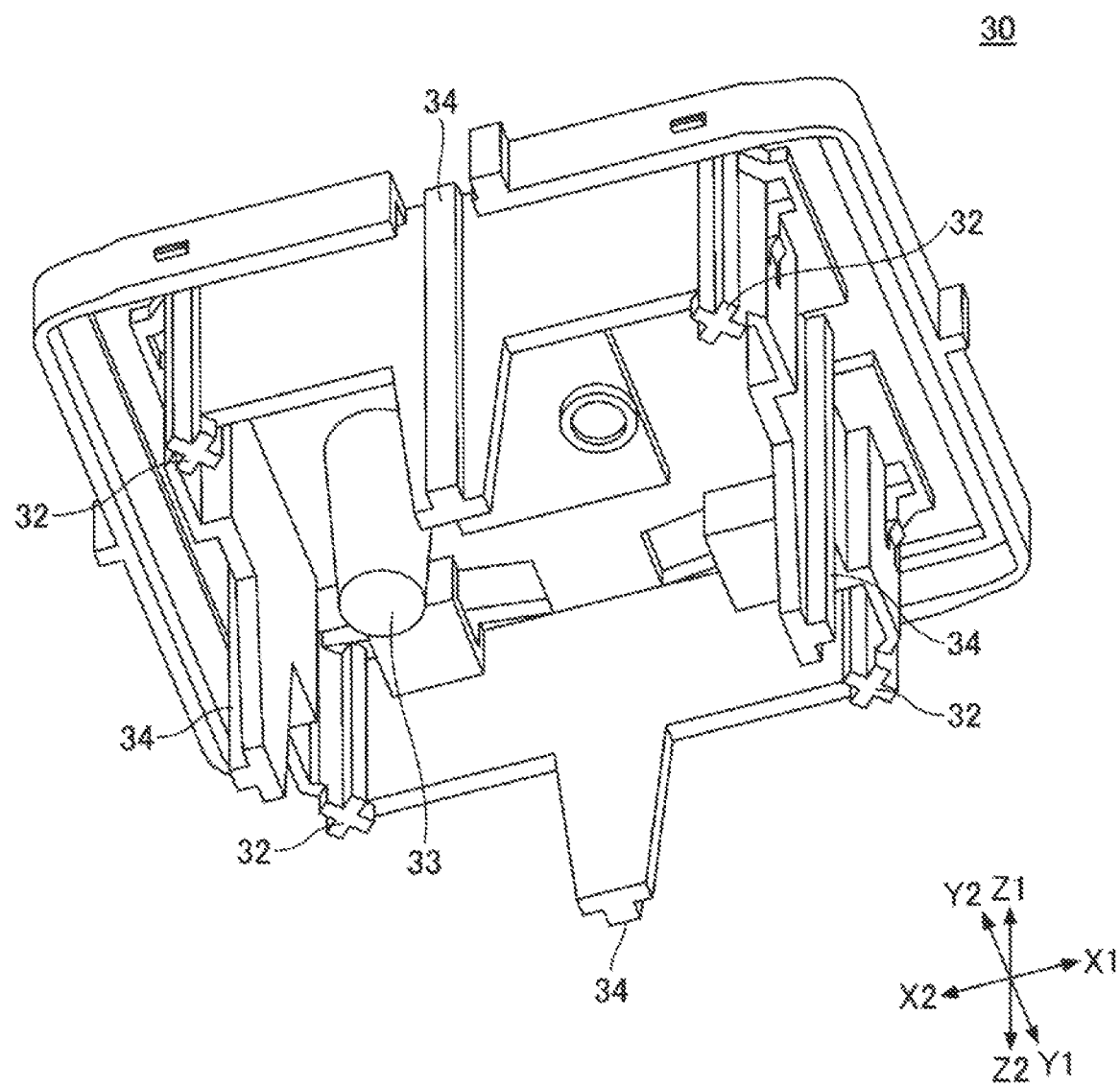
FIG. 5 is a second perspective view of a slider of the input device according to the present embodiment.

As illustrated in FIGS. 4 and 5, a surface 31, which is a Z1 side surface of the slider 30, faces the electrostatic sensor 20, and a Z2 side surface has a first protrusion 32 and a second protrusion 33 formed thereon. FIG. 4 is a perspective view seen from the Z1 side, and FIG. 5 is a perspective view seen from the Z2 side.

The first protrusion 32 is formed so as to extend in the Z1-Z2 direction. The first protrusion 32 is provided at each of the four corners of the slider 30 on the Z2 side. As a result, four first protrusions 32 are provided. The second protrusion is formed so as to extend in the Z1-Z2 direction. The second protrusion is disposed in a space surrounded by the four first protrusions 32 of the slider 30. Furthermore, a slide portion 34 is provided on each of the X1 side, the X2 side, the Y1 side, and the Y2 side of the slider 30 so as to extend in the Z1-Z2 direction. The slide portions 34 are convex outward.

Figure 6:
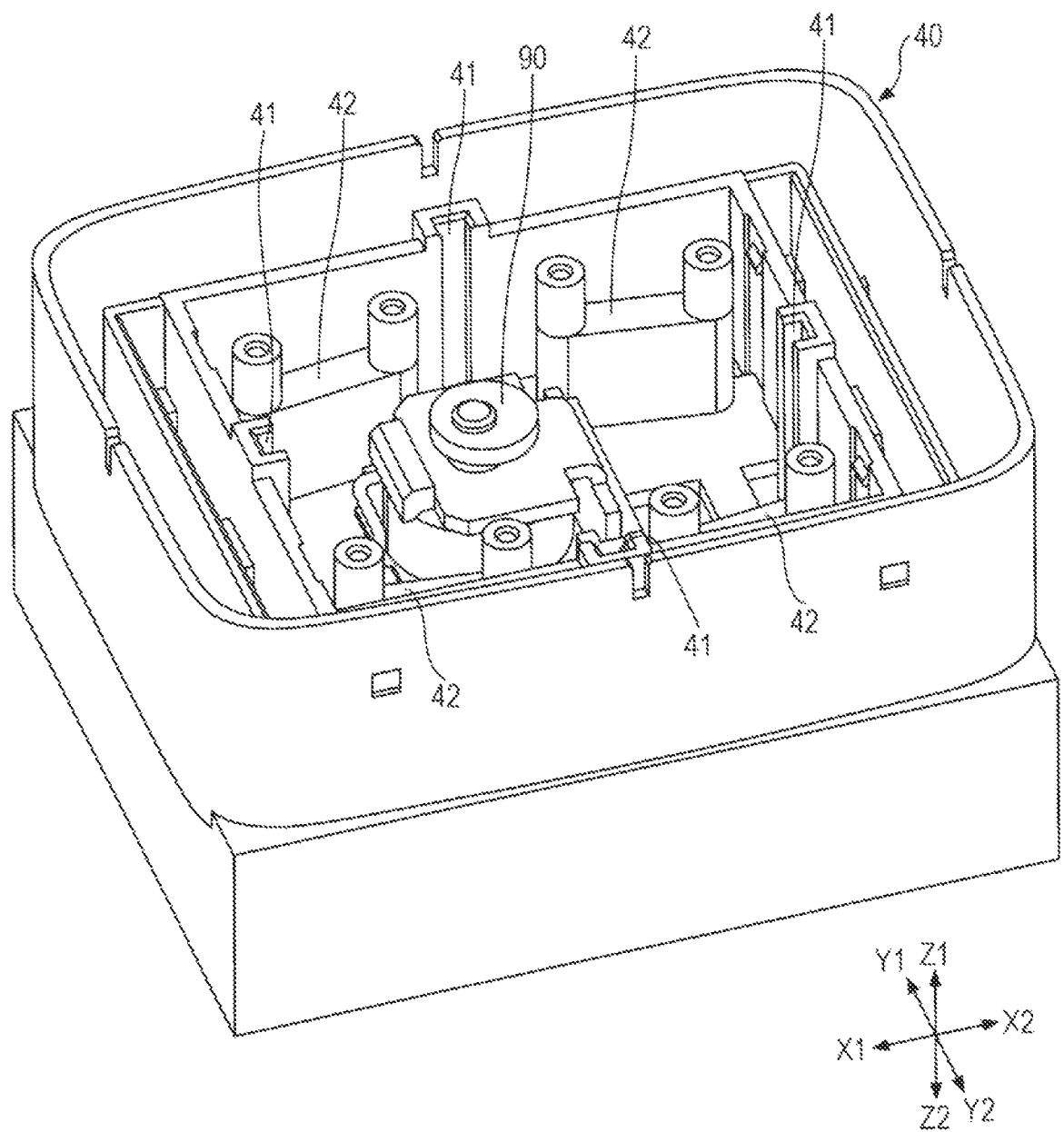
FIG. 6 is a perspective view of a housing and an actuator of the input device according to the present embodiment.

As illustrated in FIG. 6, the housing 40 is provided with groove portions 41 into which the slide portions 34 of the slider 30 are fitted in a one-to-one fashion and, thus, four groove portions 41 are also provided. A groove extending in the Z1-Z2 direction is formed in the groove portion 41, and the slide portion 34 of the slider 30 is inserted in the groove of the groove portion 41 of the housing 40. In this manner, the slider 30 can slide and move relative to the housing 40 in the Z1-Z2 direction. Four damper support portions 42 that support the second dampers 80 are provided inside the housing 40. Furthermore, an actuator 90 that generates vibration is provided inside the housing 40.

When the finger is moved laterally while touching the surface of the operation panel 10, the actuator 90 vibrates in the Z1-Z2 direction. The vibration in the Z1-Z2 direction is transmitted to the operation panel 10 via the slider 30 and, thus, the operation panel 10 vibrates in the Z1-Z2 direction.

The vibration in the Z1-Z2 direction of the operation panel 10 is transmitted to the operator's finger touching the operation panel 10 and is sensed as a tactile sensation by the operator, so that the operator can get to know that the lateral movement operation is reliably performed with their finger.

Figure 7:
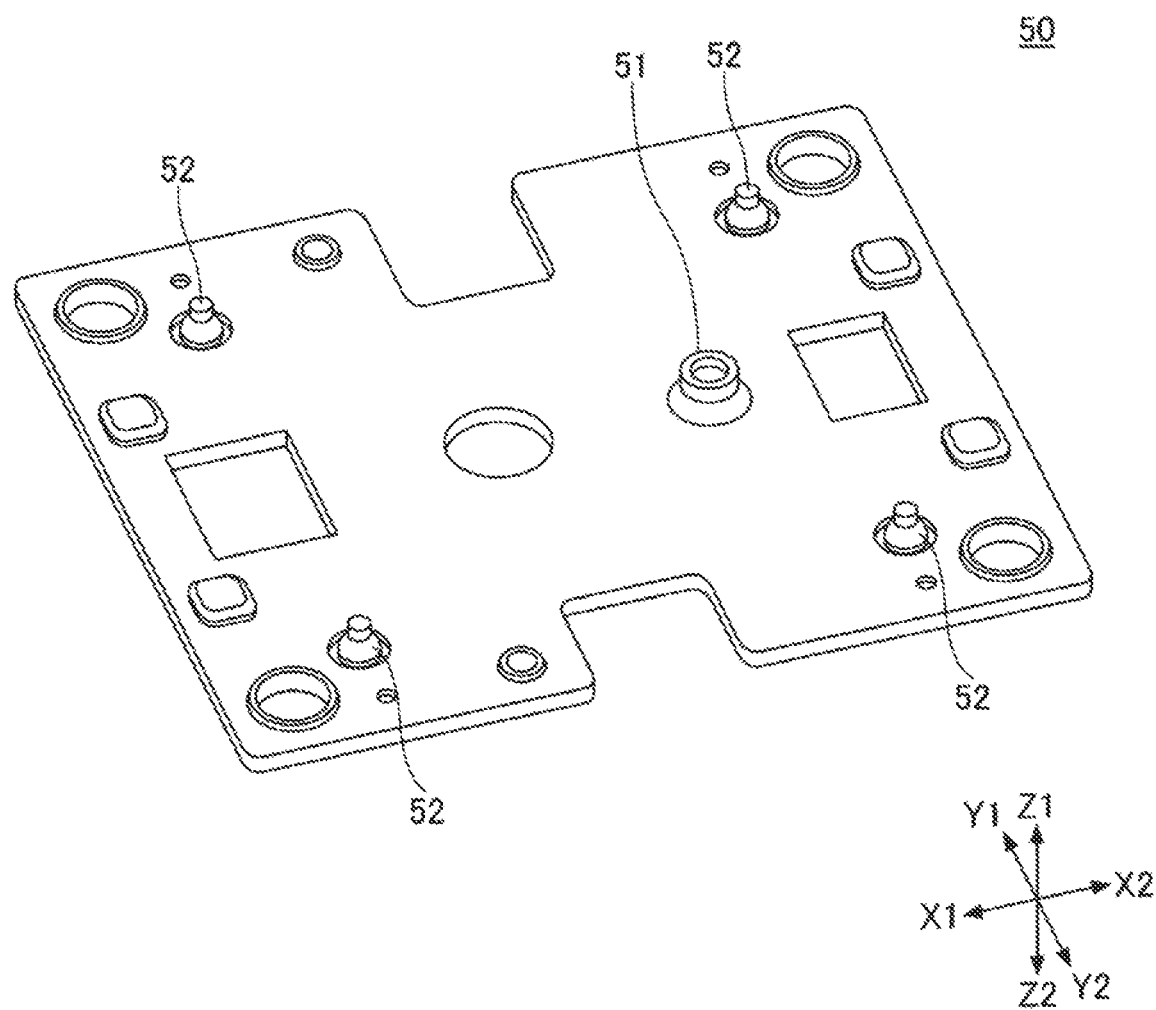
FIG. 7 is a perspective view of a waterproof rubber sheet of an input device according to the present embodiment.

As illustrated in FIG. 7, the waterproof rubber sheet 50 has a rubber dome 51 on the Z1 side surface thereof, and first dampers 52 are provided in the vicinity of the four corners of the Z1 side surface in a one-to-one fashion. As a result, the rubber dome 51 and the four first dampers 52 are integrally provided on the Z1 side surface of a single waterproof rubber sheet 50. The first damper 52 is provided at a position corresponding to the first protrusion 32 of the slider 30. As used herein, the first damper 52 is also referred to as a "first elastic portion", and the second damper 80 is also referred to as a "second elastic portion".

Figure 8:
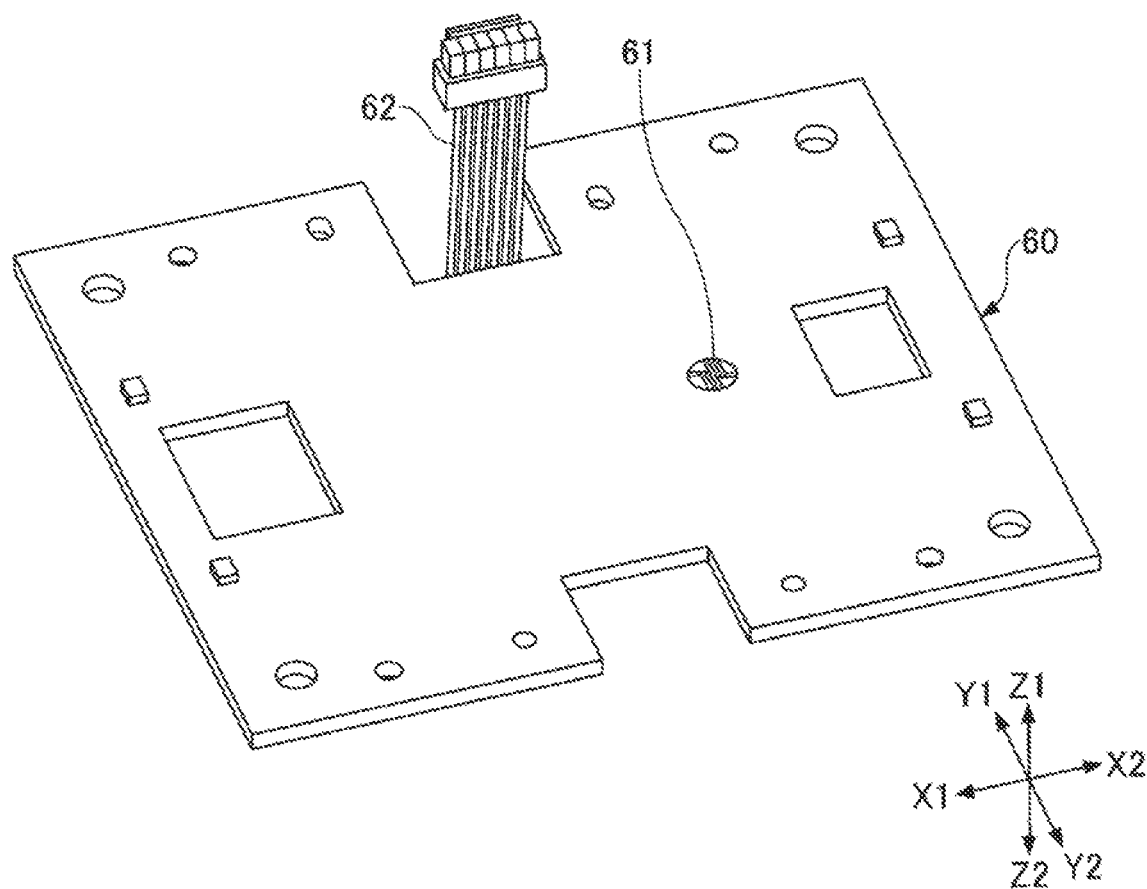
FIG. 8 is a perspective view of a circuit board of the input device according to the present embodiment.

As illustrated in FIG. 8, the circuit board 60 has a contact portion 61 on the Z1 side surface at a position corresponding to the rubber dome 51 of the waterproof rubber sheet 50. The waterproof rubber sheet 50 is mounted on the circuit board 60. A rubber dome switch consists of the rubber dome 51 of the waterproof rubber sheet 50 and the contact portion 61 of the circuit board 60. In the rubber dome switch, when the rubber dome 51 of the waterproof rubber sheet 50 is pushed toward the circuit board 60, that is, in the Z2 direction, a conductor portion provided inside the rubber dome 51 is brought into contact with the contact portion 61 of the circuit board 60. Thus, the rubber dome switch is turned on.

When the rubber dome switch is pushed and is turned on, the rubber dome switch provides an operation feeling such that the reaction force increases first and, thereafter, decreases in accordance with a change in the stroke in the Z1-Z2 direction of the operation panel 10. The operation feeling with a significant change in the reaction force in the Z1-Z2 direction is transmitted to the operation panel 10 via the slider 30 and is further transmitted to the operator's finger touching the operation panel 10. The operation feeling is sensed as a tactile sensation. As a result, the operator can recognize that the rubber dome switch has been pushed definitely. According to the present embodiment, the rubber dome switch is an example of a push switch. Instead of a rubber dome switch, another push switch capable of generating an operation feeling, such as a metal dome switch, can be used.

When the rubber dome 51 is not pushed, the conductor portion provided inside the rubber dome 51 is not in contact with the contact portion 61 of the circuit board 60 and, thus, the rubber dome switch is off. In addition, a harness 62 for connecting to the electrostatic sensor 20 and the like is connected to the circuit board 60.

Figure 9:
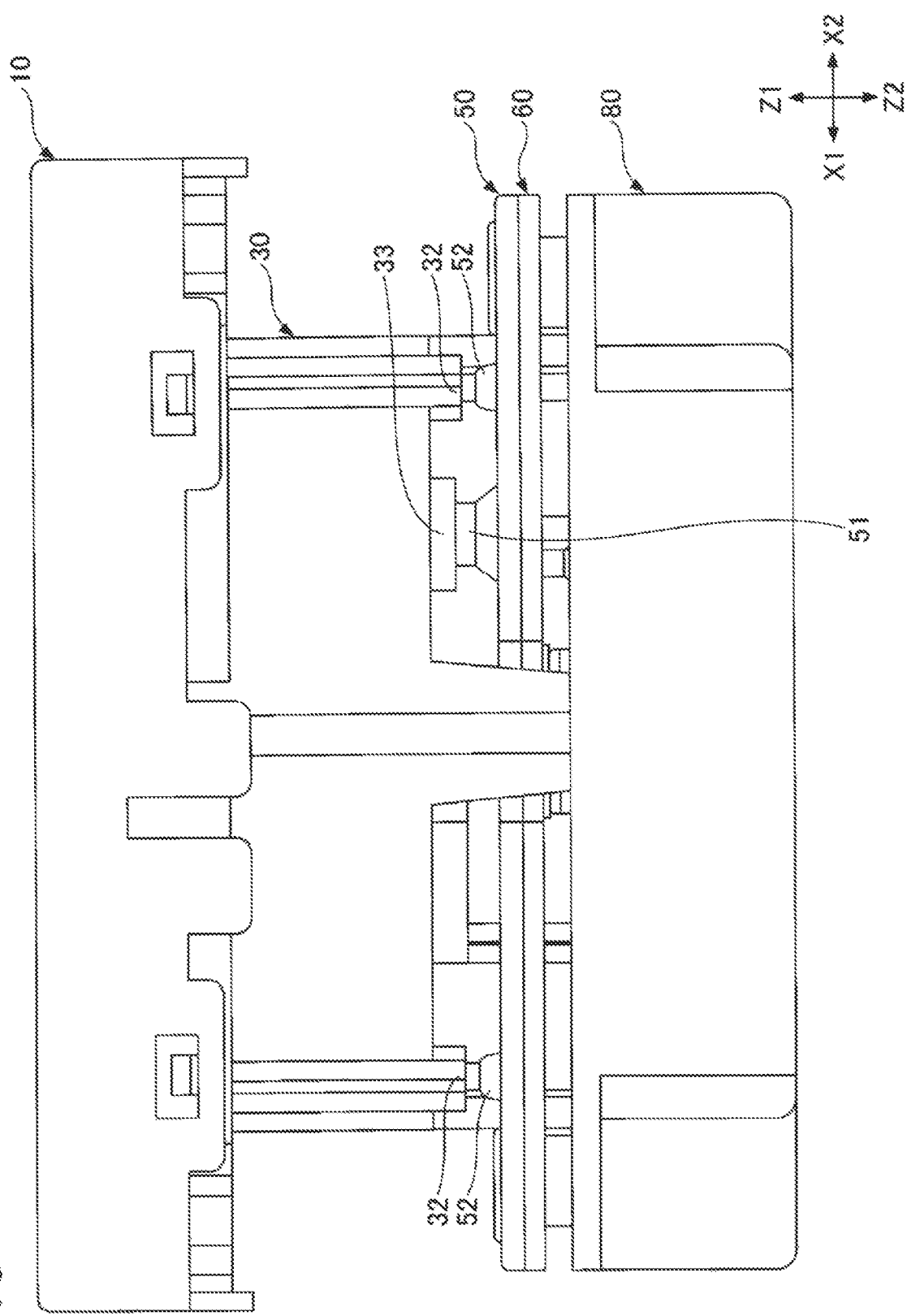
FIG. 9 is a side view of the input device with the housing removed, according to the present embodiment.
Figure 10:
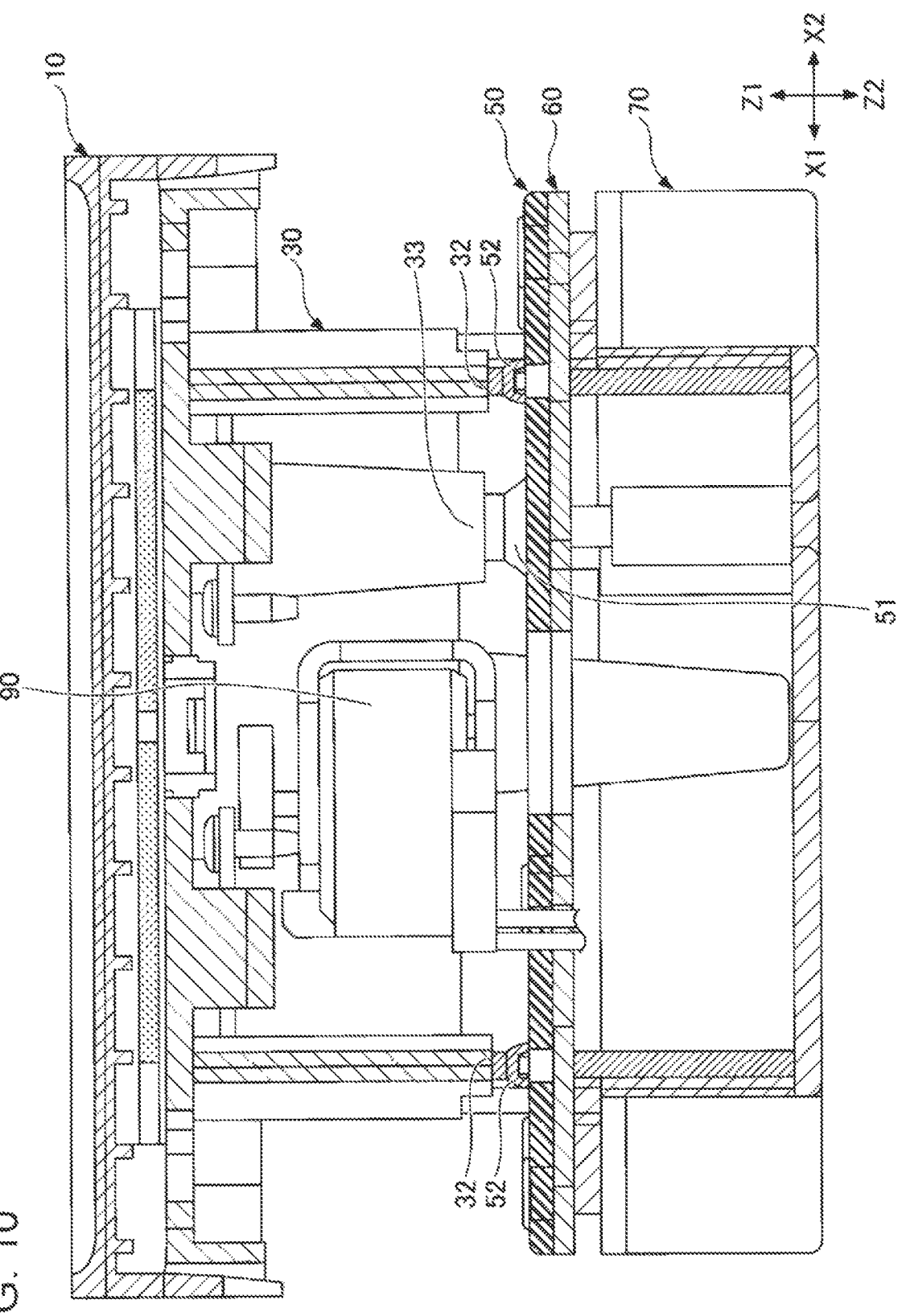
FIG. 10 is a cross-sectional view of the input device with the housing removed, according to the present embodiment.

As illustrated in FIGS. 9 and 10, in the input device according to the present embodiment, the four first protrusions 32 of the slider 30 are placed on and are mounted to the first dampers 52 of the waterproof rubber sheet 50 in a one-to-one fashion. FIG. 9 is a side view with the housing 40 removed, and FIG. 10 is a cross-sectional view taken along a plane parallel to the ZX plane.

Figure 11:
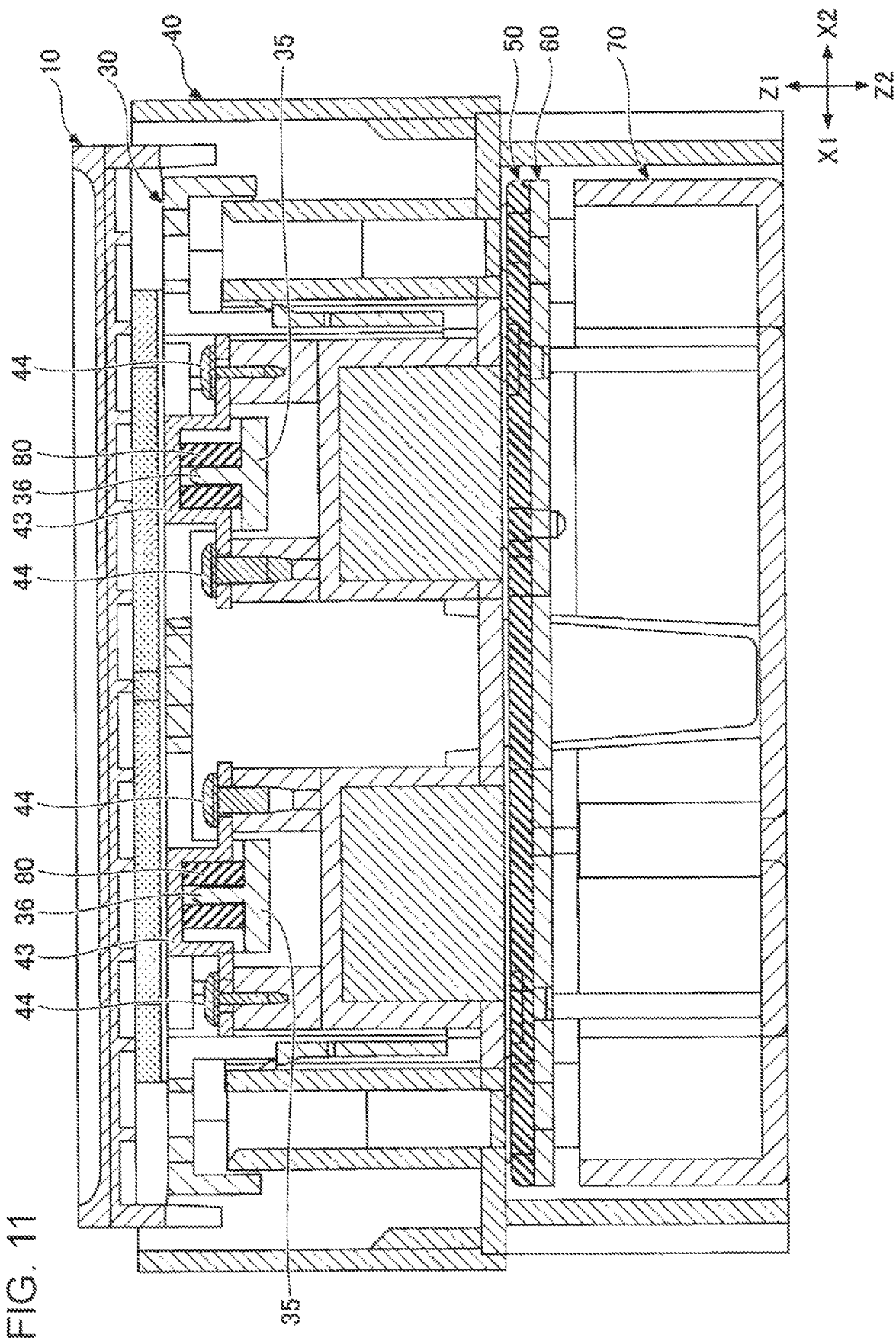
FIG. 11 is a cross-sectional view of the input device according to the present embodiment.

In addition, as illustrated in FIG. 11, the Z1 side of a support portion 35 of the slider 30 is supported by a second damper 80 attached to the damper support portion 42 of the housing 40. More specifically, a support clamp 43 is attached to the damper support portion 42 of the housing 40 by a screw 44, and the second damper 80 is sandwiched by the support clamp 43 on the Z1 side and the support portion 35 provided in the slider 30 on the Z2 side. More specifically, a pin 36 provided in the support portion 35 is inserted into the center of the second damper 80 so that the position of the second damper 80 does not shift.

As described above, the slider 30 is supported by the first damper 52 of the waterproof rubber sheet 50 on the Z2 side and is supported by the second damper 80 on the Z1 side. That is, the second damper 80 supports the slider 30 on the opposite side of the slider 30 from the first damper 52. Therefore, since the first damper 52 and the second damper 80 are formed of an elastic body, such as rubber, the slider 30 is easy to move when moving in the Z1-Z2 direction.

(Touch Operation, Push Operation)

The touch operation and the push operation performed on the input device according to the present embodiment is described below.

Figure 12:
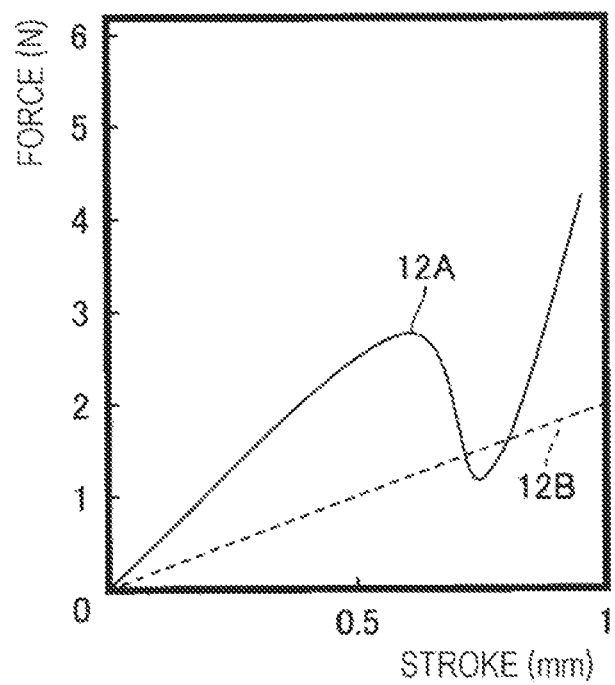
FIG. 12 is a first diagram illustrating F-S curves of the input device.

First, as a target for comparison with the input device according to the present embodiment, the case is described first in which the rubber dome 51 of the waterproof rubber sheet 50 is in contact with the second protrusion 33 of the slider 30 when the operator's finger does not touch the operation panel 10. FIG. 12 illustrates the relationship between the stroke when the operation panel 10 is pushed in the Z2 direction and the force received by the operator's finger. A curve 12A in FIG. 12 represents the force generated between the rubber dome 51 of the waterproof rubber sheet 50 and the second protrusion 33 of the slider 30, and a line 12B represents the force generated between the slider 30 and a set of the first damper 52 and the second damper 80.

When the operator's finger pushes the operation panel 10 in the Z2 direction, the reaction force received by the operator's finger from the operation panel 10 gradually increases at first in accordance with the pressed stroke and, in some region between the rubber dome 51 and the second protrusion 33 of the slider 30, the reaction force turns to decrease. If the operator's finger further pushes the operation panel 10 even after the region in which the reaction force decreases, the reaction force received by the operator's finger from the operation panel 10 gradually increases in accordance with the pressed stroke again. At a position of the stroke at which the reaction force is maximized, the rubber dome switch is turned on. Note that the force generated between the slider 30 and a set of the first damper 52 and the second damper 80 linearly changes with the stroke of the operation panel 10.

Figure 13:
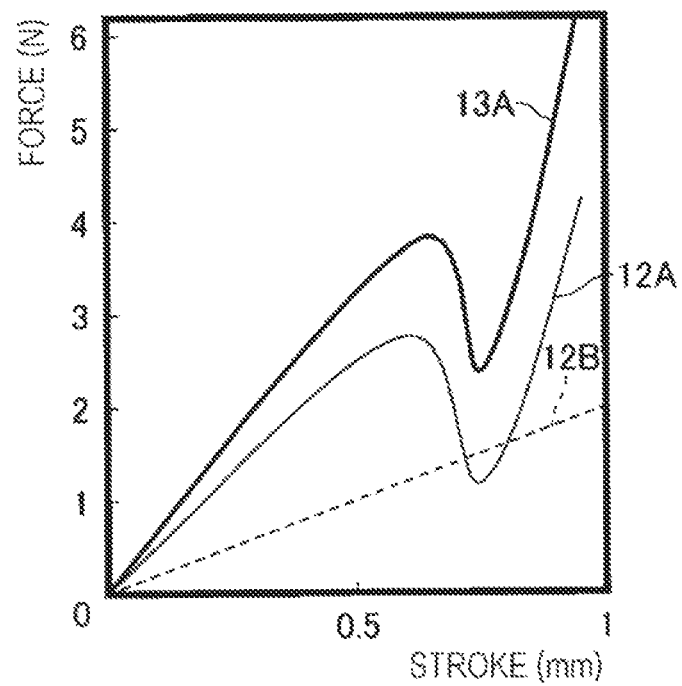
FIG. 13 is a second diagram illustrating the F-S curves of the input device.

When actually pushing the operation panel 10 in the Z2 direction, the operator's finger receives a reaction force that is the resultant force of the forces indicated by the curve 12A and the line 12B, as indicated by a curve 13A in FIG. 13. However, according to the F-S curve 13A illustrated in FIG. 13, since the reaction force gradually increases in accordance with the pressed stroke, the operator's finger does not recognize such a state until just before the rubber dome switch is pushed and is turned on. Consequently, when a touch operation is performed, a push operation may be accidentally performed and, thus, the rubber dome switch may be accidentally turned on.

Figure 14:
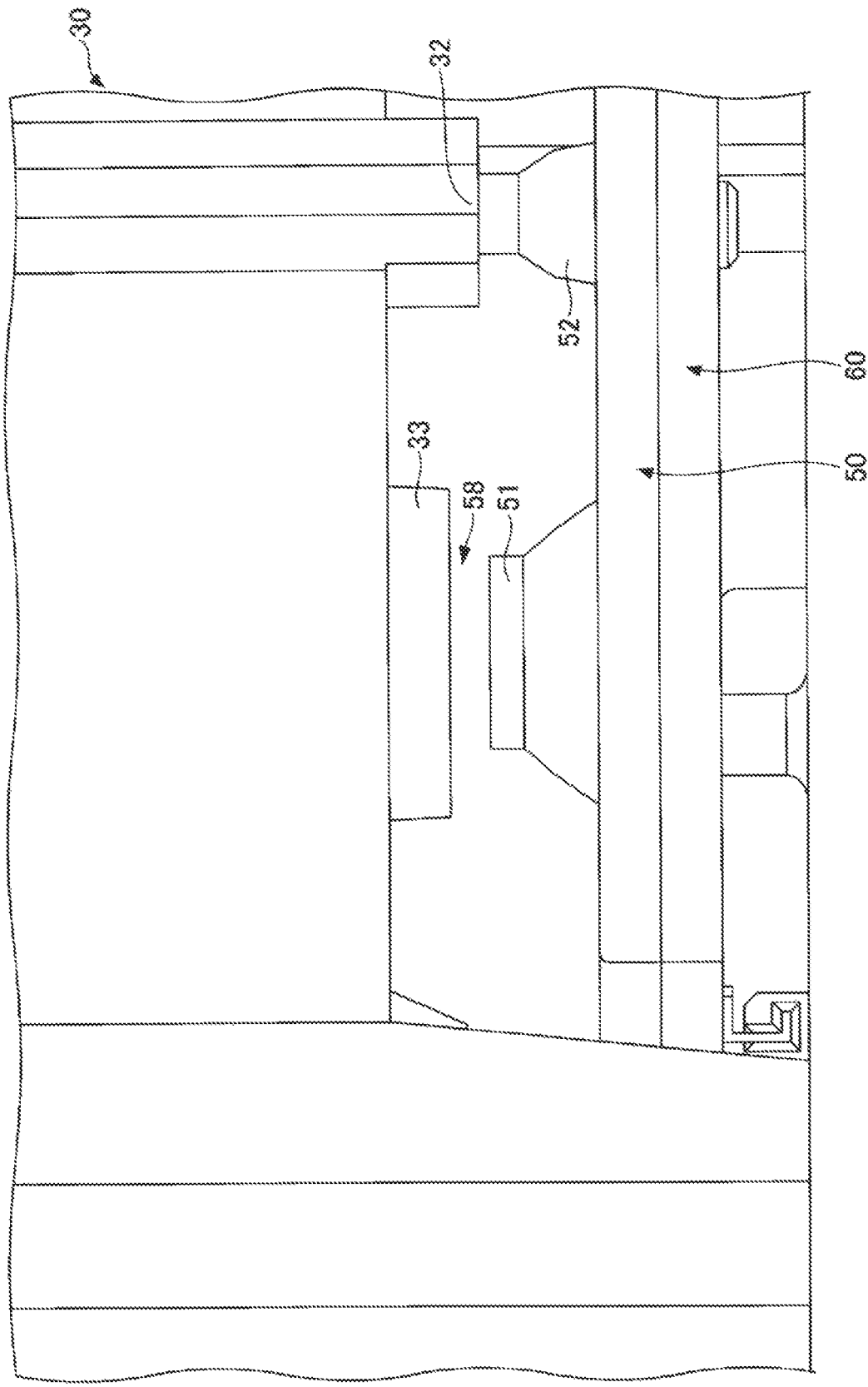
FIG. 14 illustrates the input device according to the present embodiment.

According to the input device of the present embodiment, when the operator's finger does not touch the operation panel 10, a gap 58 is formed between the second protrusion 33 of the slider 30 and the rubber dome 51 of the waterproof rubber sheet 50, as illustrated in FIG. 14.

Figure 15:
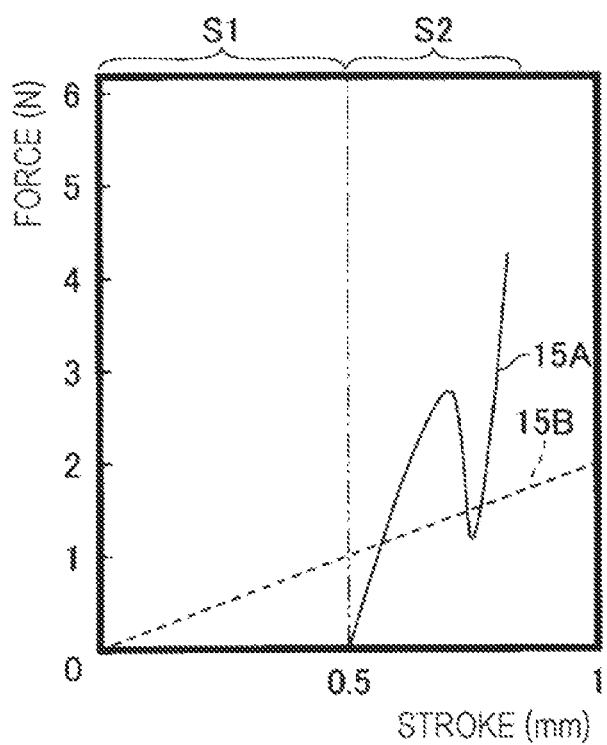
FIG. 15 is a first diagram illustrating the F-S curves of the input device according to the present embodiment.
Figure 16:
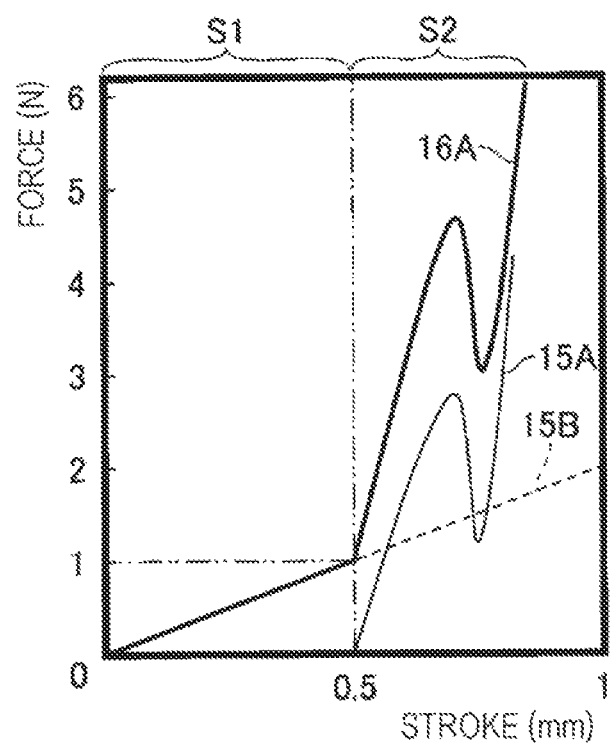
FIG. 16 is a second diagram illustrating the F-S curves of the input device according to the present embodiment.

In this manner, it is possible to determine whether the operator is performing a touch operation or attempts to perform a push operation immediately. FIG. 15 illustrates the relationship between the stroke when the operation panel 10 is pushed in the Z2 direction and the reaction force received by the operator's finger. A curve 15A in FIG. 15 represents the reaction force generated by the rubber dome 51 of the waterproof rubber sheet 50, and a line 15B represents the reaction force generated by the first damper 52 and the second damper 80. Note that the reaction force generated by the first damper 52 and the second damper 80 linearly changes with the stroke of the operation panel 10. The reaction force generated by the rubber dome 51 decreases at some point of the stroke. A curve 16A in FIG. 16 represents the reaction force received by the operator's finger when the operator's finger actually pushes the operation panel 10 in the Z2 direction, and the reaction force is the resultant force of the reaction force represented by the curve 15A and the reaction force represented by the curve 15B.

When the operator's finger performs a touch operation, the operation panel 10 is slightly pushed in the Z2 direction by the operator's finger. At this time, the region of the stroke in which the operation panel 10 is pushed by the touch operation is referred to as a first stroke region S1, and the reaction force in the first stroke region S1 is referred to as a first reaction force.

In the push operation, the operation panel 10 is largely pushed in the Z2 direction by the operator's finger, and the gap 58 formed between the second protrusion 33 and the rubber dome 51 disappears. Then, the rubber dome 51 is pushed, and the rubber dome switch is turned on. At this time, since the rubber dome 51 is deformed before the rubber dome switch is turned on, the reaction force received by the operator's finger gradually increases in accordance with the stroke of the operation panel 10 pushed by the operator's finger. When the operation panel 10 is further pushed by the operator's finger, the reaction force turns to decrease at some point. Thereafter, if the operation panel 10 is further pushed, the reaction force received by the operator's finger gradually increases in accordance with the pressed stroke again. Subsequently, at the position of the stroke at which the reaction force is maximized, the rubber dome switch is turned on. A region of the stroke in the vicinity of the point at which the push operation is performed in this manner is defined as a second stroke region S2, and the reaction force in the second stroke region S2 is defined as a second reaction force.

According to the present embodiment, in the first stroke region S1, when the operator's finger pushes the operation panel 10, the slider 30 slides and moves in the Z2 direction. However, since the second protrusion 33 of the slider 30 is not in contact with the rubber dome 51 of the waterproof rubber sheet 50, no reaction force is generated by the rubber dome 51 of the waterproof rubber sheet 50. For this reason, in a touch operation, the force received by the operator's finger is only the reaction force caused by the deformation of the first damper 52 and the second damper 80.

In the second stroke region S2, the second protrusion 33 of the slider 30 and the rubber dome 51 of the waterproof rubber sheet 50 are in contact with each other, and the operator's finger receives the reaction force represented by the F-S curve 16A, which is the resultant force of the forces represented by the curve 15A and the line 15B. In the second stroke region S2, the reaction force received by the operator's finger is the resultant force of the reaction force caused by the deformation of the first damper 52 and the second damper 80 and the reaction force caused by the deformation of the rubber dome 51.

Therefore, in the vicinity of the boundary between the first stroke region S1 and the second stroke region S2, the amount of change in the first reaction force with respect to the stroke length in the first stroke region S1 is less than the amount of change in the second reaction force with respect to the stroke length in the second stroke region S2, and the difference is large.

Consequently, the operator can recognize the boundary between the first stroke region S1 and the second stroke region S2 and, thus, can determine whether their finger is performing a touch operation or a push operation. In this manner, it can be prevented that the operator accidentally turns on the rubber dome switch when performing a touch operation with their finger. Note that according to the present embodiment, to prevent long total stroke length, it is desirable that the rubber dome switch have a short stroke when being turned on.

While the embodiment has been described in detail above, the present invention is not limited to the specific embodiment, and various modifications and changes can be made within the scope described in the claims.

For example, according to the above-described embodiment, the gap 58 is provided between the second protrusion 33 and the rubber dome 51. However, instead of providing a gap, a contact portion between the second protrusion 33 and the rubber dome 51 may have such a shape and a material as to be significantly easily elastically deformed and, thus, the reaction force generated by the rubber dome switch may exhibit substantially the same operation and effect as when the gap 58 is provided. Such a configuration is also encompassed within the technical scope of the present invention.

What is claimed is:

1. An input device comprising:
   an operation panel including an electrostatic sensor, the operation panel allowing a touch operation and a push operation to be performed thereon;
   a push switch configured to generate an operation feeling for an operator;
   a transmission member disposed between the operation panel and the push switch;
   a first elastic portion configured to support the transmission member; and
   an actuator configured to generate vibration,
   wherein the touch operation is an operation performed by the operator to touch a surface of the operation panel with the operator's finger and move the operator's finger,
   wherein the actuator vibrates in response to detecting lateral movement of the finger by the electrostatic sensor in the touch operation, and the vibration is transmitted to the operation panel via the transmission member,
   wherein the push operation is an operation performed by the operator to push the operation panel, and the first elastic portion and the push switch are pushed via the transmission member,
   wherein in a first stroke region in which the operation panel is pushed in the touch operation, a first reaction force exerted by pushing the operation panel is generated by the first elastic portion,
   wherein in a second stroke region subsequent to the first stroke region during the push operation, a second reaction force caused by pushing the operation panel is a resultant force of the reaction force generated by the first elastic portion and the operation feeling generated by the push switch,
   wherein in the vicinity of a boundary between the first stroke region and the second stroke region, an amount of change in the first reaction force with respect to a stroke length is less than an amount of change in the second reaction force with respect to the stroke length,
   wherein the push switch is a rubber dome switch formed from a contact portion provided in a circuit board and a rubber dome provided in a rubber sheet mounted on the circuit board, and
   wherein the first elastic portion is provided in the rubber sheet.

2. The input device according to claim 1, wherein the first reaction force linearly changes with the stroke of the operation panel, and the second reaction force changes so as to increase with an increase in the stroke of the operation panel first and turn to decrease during the increase.

3. The input device according to claim 2, wherein when the operation panel is not pressed, a gap is formed between the transmission member and the push switch.

4. The input device according to claim 2, further comprising:
   a second elastic portion configured to support the transmission member on the opposite side in a direction of the push operation.

5. The input device according to claim 1, wherein when the operation panel is not pressed, a gap is formed between the transmission member and the push switch.

6. The input device according to claim 1, further comprising:
   a second elastic portion configured to support the transmission member on the opposite side in a direction of the push operation.

7. The input device according to claim 6, wherein when the operation panel is not pressed, a gap is formed between the transmission member and the push switch.

* * * * *